(12) United States Patent
Mohammadi et al.

(10) Patent No.: US 9,197,179 B2
(45) Date of Patent: Nov. 24, 2015

(54) LOW VOLTAGE TRANSMITTER

(71) Applicant: BROADCOM CORPORATION, Irvine, CA (US)

(72) Inventors: Behnam Mohammadi, Irvine, CA (US); Masoud Kahrizi, Irvine, CA (US); Ahmad Mirzaei, Orlando, FL (US); Bernd Pregardier, Oceanside, CA (US); John Cumming Leete, Huntington Beach, CA (US)

(73) Assignee: Broadcom Corporation, Irvine, CA (US)

( * ) Notice: Subject to any disclaimer, the term of this patent is extended or adjusted under 35 U.S.C. 154(b) by 110 days.

(21) Appl. No.: 14/040,388

(22) Filed: Sep. 27, 2013

(65) Prior Publication Data

US 2015/0065072 A1    Mar. 5, 2015

Related U.S. Application Data

(60) Provisional application No. 61/872,457, filed on Aug. 30, 2013.

(51) Int. Cl.
*H04B 1/04* (2006.01)
*H01Q 11/12* (2006.01)
*H03G 3/30* (2006.01)

(52) U.S. Cl.
CPC .................... *H03G 3/3042* (2013.01)

(58) Field of Classification Search
CPC ......... H03G 3/20; H03G 3/3042; H03G 3/30; H04B 1/04; H04B 1/44; H04B 1/0458; H03F 3/72
USPC ........... 330/278, 129, 279, 124 R; 455/127.2, 455/127.3, 232.1, 127.1, 164.2, 164.1, 455/182.1, 182.2, 192.1, 192.2, 240.1, 455/247.1, 114.3
See application file for complete search history.

(56) References Cited

U.S. PATENT DOCUMENTS

| | | | | |
|---|---|---|---|---|
| 7,068,100 | B2 * | 6/2006 | Dauphinee et al. | 330/129 |
| 7,248,845 | B2 * | 7/2007 | Dunn | 455/127.1 |
| 7,256,384 | B2 * | 8/2007 | Gottesman et al. | 250/214 C |
| 7,362,172 | B2 * | 4/2008 | Tanaka et al. | 330/129 |
| 7,795,967 | B2 * | 9/2010 | Nakai et al. | 330/129 |
| 8,085,089 | B2 * | 12/2011 | Rofougaran | 330/129 |
| 8,519,786 | B2 * | 8/2013 | Jang et al. | 330/86 |
| 2008/0070520 | A1 * | 3/2008 | Mitter et al. | 455/127.2 |
| 2008/0278240 | A1 * | 11/2008 | Sirito-Olivier et al. | 330/284 |
| 2011/0227651 | A1 * | 9/2011 | Hurwitz et al. | 330/254 |
| 2012/0319775 | A1 * | 12/2012 | Nakamura | 330/129 |
| 2013/0029624 | A1 * | 1/2013 | Bendsen | 455/234.1 |
| 2013/0271307 | A1 * | 10/2013 | Kropfitsch et al. | 341/158 |
| 2013/0335146 | A1 * | 12/2013 | Takahashi et al. | 330/279 |
| 2014/0220910 | A1 * | 8/2014 | Jia et al. | 455/78 |
| 2014/0312974 | A1 * | 10/2014 | Khesbak et al. | 330/279 |
| 2014/0334643 | A1 * | 11/2014 | Pinna et al. | 381/107 |

* cited by examiner

*Primary Examiner* — Pablo Tran

(74) *Attorney, Agent, or Firm* — Garlick & Markison; Randy W. Lacasse

(57) ABSTRACT

A wireless communications transmitter is divided into N binary weighted communication signal processing paths including both fixed and variable gain communication signal processing chains. Specific bit sequences are used to select a combination of fixed and variable gain signal processing paths to adjust to a desired transmitter output power. Alternately, high and low power communication signal processing paths are chosen as needed with the high power communication signal processing path including an odd order harmonic notch filter.

16 Claims, 7 Drawing Sheets

LOW VOLTAGE TRANSMITTER

CROSS REFERENCE TO PRIORITY APPLICATION/INCORPORATION BY REFERENCE

The present U.S. Utility patent application claims priority pursuant to 35 U.S.C. §119(e) to U.S. Provisional Application Ser. No. 61/872,457, entitled "Low Voltage Transmitter," filed Aug. 30, 2013, which is hereby incorporated herein by reference in its entirety and made part of the present U.S. Utility patent application for all purposes.

BACKGROUND

1. Technical Field

The present disclosure described herein relates generally to wireless communications and more particularly to transmitters used to support wireless communications.

2. Description of Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP (3rd Generation Partnership Project), 4GPP (4th Generation Partnership Project), LTE (long term evolution), LTE Advanced, RFID, IEEE 802.11, Bluetooth, AMPS (advanced mobile phone services), digital AMPS, GSM (global system for mobile communications), CDMA (code division multiple access), LMDS (local multi-point distribution systems), MMDS (multi-channel-multi-point distribution systems), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the transmitter is coupled to one or more antennas for transmission (e.g., LTE). However, as wireless capacities grow, the transmitters are increasingly consuming power.

BRIEF DESCRIPTION OF THE DRAWING(S)

DETAILED DESCRIPTION

Figure 1:
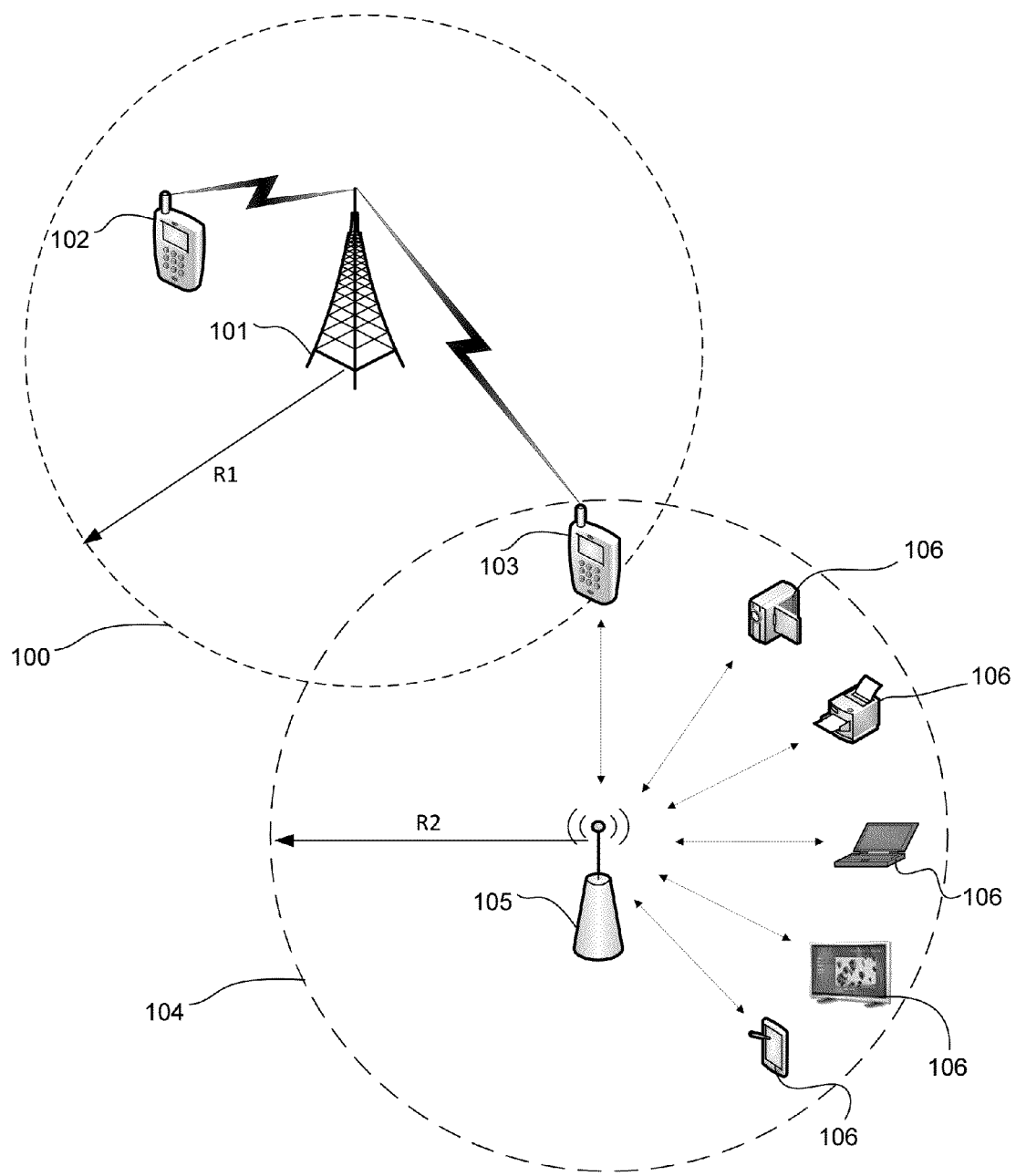
FIG. 1 illustrates an example communication cell structure and a wireless local area network (WLAN) in accordance with the present disclosure.

FIG. 1 illustrates an example cellular network cell structure and a wireless local area network (WLAN) in accordance with the present disclosure. A cellular network or mobile network is a radio network distributed over land areas called cells, each served by at least one fixed-location transceiver. In a cellular network, each cell uses a different set of radio frequencies (RF) from neighboring cells, to avoid interference and provide guaranteed bandwidth within each cell. A WLAN links wireless devices using a wireless distribution method (typically spread-spectrum or orthogonal frequency-division multiplexing (OFDM) radio), and usually provides a connection through an access point to the wider Internet using, for example, IEEE 802.11 standards, such as Wi-Fi. Both the cell structure and WLAN include a geographic area for reception/transmission of wireless signals (RF) by one or more mobile communication devices. Mobile communication devices include, but are not limited to, mobile phones, smartphones, tablets, etc. As shown, cell 100 encapsulates a general reception/transmission area extending radially (R1) from cell tower 101. Various mobile communication devices, known as user equipment (UE), 102 and 103 transmit and receive signals to/from cell tower 101. Cell tower 101 typically includes a cell node (eNB) with base station connection to a cellular operator's network and eventual connection to a telephone network (not shown). The base station includes at least a transceiver (transmitter (TX) and receiver (RX)) and processing module.

WLAN 104 encapsulates a general reception/transmission area extending radially (R2) from access point (AP) 105. Various mobile communication devices such as UE 103 and other devices 106 (e.g., cameras, printers, laptops, TVs, tablets, etc.) will be connected through transmission and reception of wireless signals to/from AP 105, which typically would include an additional connection to, for example, the Internet. Although illustrated as a structured WLAN (i.e., with an access point (105)), the WLAN, can in one or more embodiments, be formed as an adhoc peer-to-peer (P2P) network with one UE (e.g., 103/106) in the WLAN acting as a group owner (GO)) and performing connection and networking functions of devices within the group.

Figure 2:
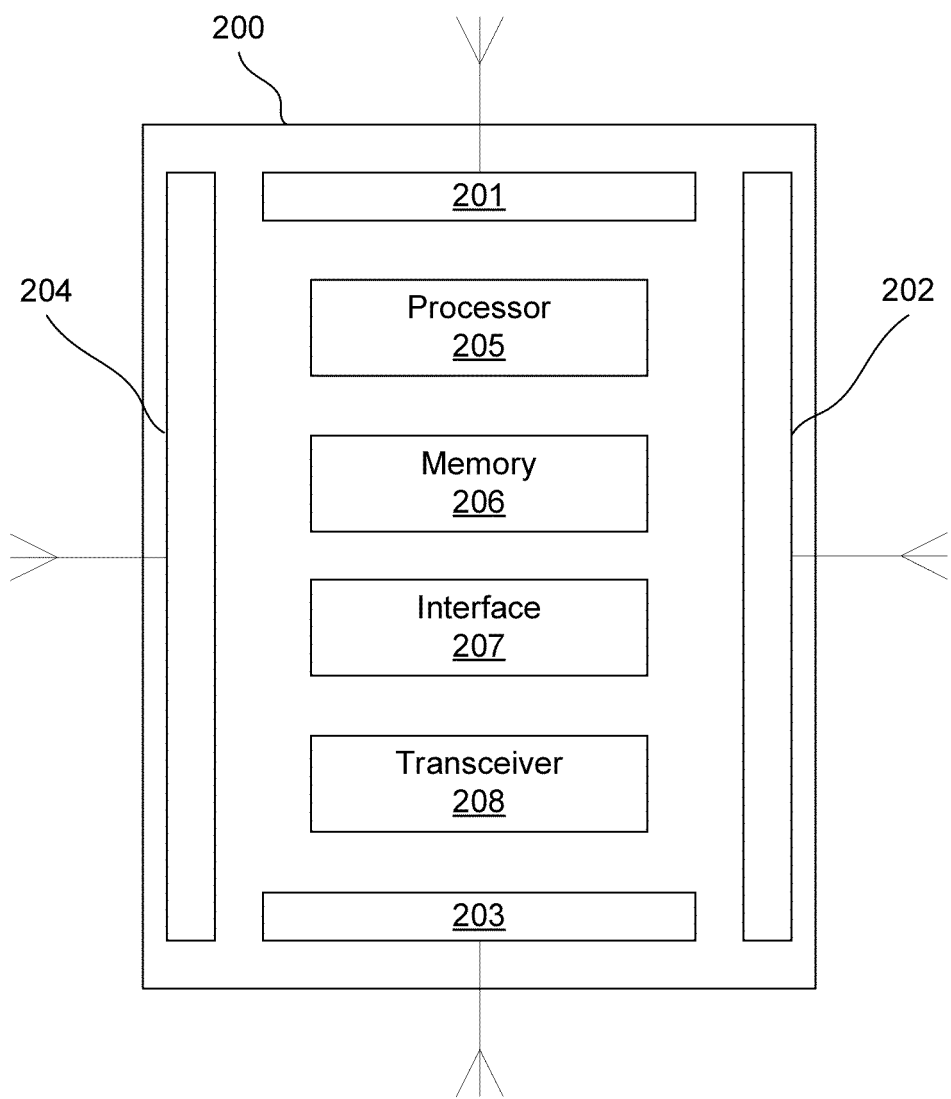
FIG. 2 illustrates a schematic block diagram of cellular communications circuitry for a mobile communications device in accordance with the present disclosure.

FIG. 2 illustrates an example schematic block diagram of cellular communications circuitry for a mobile communications device (e.g., UE 103) in accordance with the present disclosure. Cellular capable wireless communications devices (e.g., UEs) are typically constructed with multiple antennas that support various communications protocols. In one embodiment, mobile communications device 200 includes: cellular antenna 201 (e.g., 3G, 4G, LTE, etc.), accessory antenna 202, diversity antenna 203 and multi-use WLAN/Bluetooth (BT) antenna 204. In one or more embodiments, accessory antennas include, but are not limited to, Global Positioning System (GPS), Near Field Communications (NFC) and other short-range communication protocol antennas.

Mobile communications device 200 also includes processor module 205 to process both communication and non-communication functions of the mobile communications device (e.g., antenna allocation). In addition, communication and non-communication data is stored in memory 206. Interface 207, in conjunction with processor module 205, includes processing of visual and non-visual external and internal data. Wireless communications device 200 also includes one or more transceiver modules (transmitter and receiver) 208 each with one or more radio signal processing chains (i.e., sequence of connected transmitter/receiver components (amplifiers, filters, mixers, converters, etc.)) as is known in the art of mobile communications devices.

Multimode transmitters are designed to meet combined linearity and power control specifications while consuming as little power as possible, for example, to maximize battery life. A multimode transmitter transmits a baseband signal in one mode or a multi-band signal in one or more additional modes. In order to support current (i.e., 3G, 4G, LTE, etc.) and future cellular networks, transmitters are designed to be highly linear. For example, highly linear transmitters are typically needed to meet 3GPP requirements such as resource block (RB) allocation and Universal Mobile Telecommunications System Terrestrial Radio Access (UMTS UTRA) Adjacent Channel Leakage Ratio (ACLR) into a 3G channel.

Current transmitter designs use a high voltage supply and implant some of the gain control in the baseband or the mixer. This type of configuration uses higher voltage supply and is not typically suitable for complementary metal-oxide-semiconductor (CMOS) technology (e.g., 28 nm) and system-on-a-chip (SOC) implementation. Additionally, transmitters of this design typically experience interference problems such as imaging, local oscillator feed through (LOFT) and pulling problems during operation.

Figure 3:
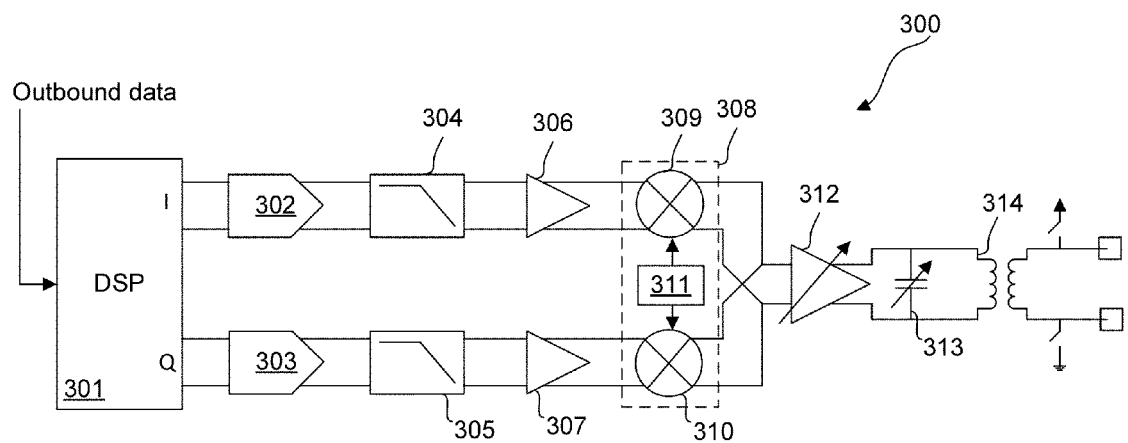
FIG. 3 illustrates a circuit diagram for a transmitter in accordance with the present disclosure.

FIG. 3 illustrates a circuit diagram for a transmitter in accordance with the present disclosure. The transmitter functions include, but are not limited to, scrambling, encoding, constellation mapping, modulation, and/or digital baseband to intermediate frequency (IF) conversion. The transmitter digital signal processing (DSP) module 301 may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The DSP may include memory which includes a single memory device or a plurality of memory devices. Such a memory device may be a read-only memory, random access memory, volatile memory, non-volatile memory, static memory, dynamic memory, flash memory, and/or any device that stores digital information and is located internal or external to the DSP.

In operation, the transmitter 300 receives outbound data from a host device (e.g., wireless communications device). DSP 301 processes the outbound data in accordance with a particular wireless communication standard (e.g., IEEE 802.11, LTE, Bluetooth, etc.) to produce digital transmission formatted data. The digital transmission formatted data will be a digital baseband signal or a digital low IF signal, where the low IF typically will be in the frequency range of one hundred kilohertz to a few megahertz. DSP 301 converts the outbound data into outbound baseband signals, which include an in-phase component (I) and a 90 degrees out-of-phase quadrature component (Q). Digital-to-analog converters (DAC) 302 and 303 convert the in-phase and quadrature baseband signal components into their respective analog signals. The signals are filtered by low pass filters 304 and 305 to filter and/or adjust the gain of the analog signal prior to providing it to an IF mixing stage 308 for up-conversion. Amplifiers 306 and 307 provide buffering before up-conversion of the signals. The IF mixing stage 308 up-converts the analog baseband or low IF signal into an RF signal. The signals are up-converted by mixers 309 and 310 where the baseband signal components and local oscillation from local oscillation generator (LOGEN) 311 are combined. The outputs of mixers 309 and 310 are summed to produce a radiofrequency (RF) signal. The RF signal is amplified by variable power amplification (PA) driver 312 and passed through variable capacitor 313 and transformer 314 to provide impedance matching for the output network. Typically, a power amplifier (not shown) amplifies the TX output signal to produce an outbound RF signal, which is filtered by a transmitter filter module (not shown) and transmitted by an antenna (not shown) to a targeted device such as a base station, an access point and/or another wireless communication device.

This type of transmitter still uses a high voltage supply where the PA driver typically uses device stacking to obtain a high input to output isolation for accurate gain control of close to 80 dB. Once again, this configuration results in higher power consumption due to the higher voltage supply and linearity requirements. A change in power by a factor of 10 is a 10 dB change in level. A change in voltage by a factor of 10 is equivalent to a change in power by a factor of 100 and is thus a 20 dB change. A change in voltage ratio by a factor of two is approximately a 6 dB change.

In one or more embodiments of the technology described herein, a transmitter is provided that is divided into N binary weighted paths. The transmission (TX) path of the output signal depends on the TX output power where all power hungry block currents are scaled in order to reduce the overall power consumption. Using weighted paths, local oscillation (LO) isolation is maintained at low TX power eliminating the need for device stacking. Additionally, the configuration provides increased headroom achieving improved linearity. As a result, the PA driver is operational at a lower supply voltage provided substantially lower power consumption and longer battery life.

Figure 4:
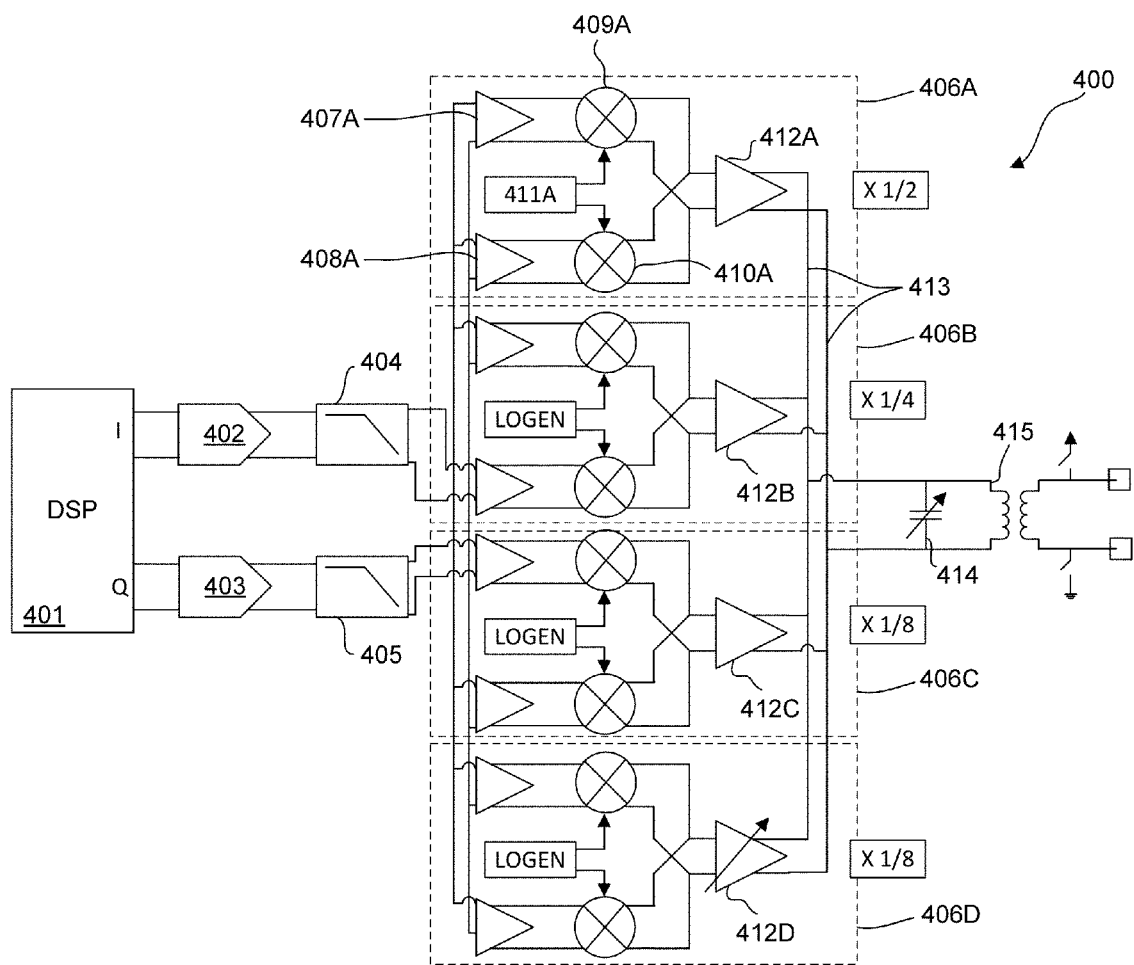
FIG. 4 illustrates one embodiment of a circuit diagram for a transmitter in accordance with the present disclosure.

FIG. 4 illustrates one embodiment of a circuit diagram for a transmitter in accordance with the present disclosure. In operation, transmitter 400 includes DSP 401 for converting outbound data into outbound baseband signals, which include an in-phase component (I) and a quadrature component (Q). Digital-to-analog converters 402 and 403 convert the in-phase and quadrature baseband signal components into analog signals. The baseband signals are filtered by low pass filters 404 and 405. The baseband signals are provided to one of four (N) weighted TX paths (communication signal processing chains) 406A, 406B, 406C or 406D depending on the desired TX output power.

For purposes of simplicity, elements of fixed gain communication signal processing chains 406A, 406B and 406C are operationally similar and therefore, for simplicity, only 406A will be described in full. Each fixed gain chain includes amplifiers 407A and 408A to provide buffering before up-conversion of the signals. An IF mixing stage includes mixers 409A and 410A where baseband signal components and local oscillation from local oscillation generator (LOGEN) 411A are combined. The outputs of mixers 409A and 410A are summed to produce a radiofrequency (RF) signal. The up-converter converts the analog baseband or low IF signal into an RF communication signal based on the transmitter local oscillator generator (LOGEN) 411A. The RF communication signal is amplified by a fixed gain power amplifier (PA) driver 412A. Fixed gain power amplifier drivers 412A, 412B and 412C may be of a different fixed gain depending on its weighting. For example, as shown communication signal processing chains 406A, 406B, 406C are weighted 1:2, 1:4, and 1:8 indicating that they handle one-half, one-quarter and one-eighth of the total desired circuit output power. Variable gain communication signal processing chain 406D, operates as per discussion of 406A-C, with the exception that the amplifier 412D is a variable power amplifier driver. In this example embodiment, the variable amplifier chain 406D has a 1:8 weighting, indicating that it can handle from zero to one-eighth of the total desired circuit output power. To provide the requisite weighting, one or more components (e.g., transistors) of each of the communication signal processing chains is scaled to produce the weighted power output. Pre-amplified RF communication signals are combined 413 and passed through variable capacitor 414 and transformer 415 to provide impedance matching for the output network.

In one embodiment, a selection bit sequence, for example a binary sequence of bits, is output from the DSP (or other processor within the host device) to first select or deselect (engage or disengage) one or more of the a plurality of fixed gain communication signal processing chains to provide course power tuning. For example (using deselection), as shown in FIG. 4, assuming all four of the communication signal processing chains 406A-D are engaged (full power), a two-bit binary sequence could deselect (disengage) each of the four (N=4) path communication signal processing chains as needed. In this example, the bits "11" would deselect the first processing chain 406A (reducing power by half); bits "10" would deselect the second processing chain 406B (reducing power by one quarter), bits "01" would deselect the third processing chain (reducing power by one eighth), and bits "00" would deselect the fourth (variable gain) chain 406D. Any combination of fixed and variable gain processing chains can be selected or deselected to achieve a desired TX power output. In one embodiment, one or more most significant bits (MSB) (e.g., 2 bits) of the selection bit sequence are used to select/deselect one of the N paths (course power tuning) and one or more least significant bits (LSB) (e.g., 4 bits) of the selection bit sequence are used to select a specific gain from a set of possible gains for the fourth variable gain processing chain (fine power tuning). In this example, the selection bit sequence (6 bit) provides at least 6 dB of gain control per bit or 36 dB of gain control overall.

Figure 5:
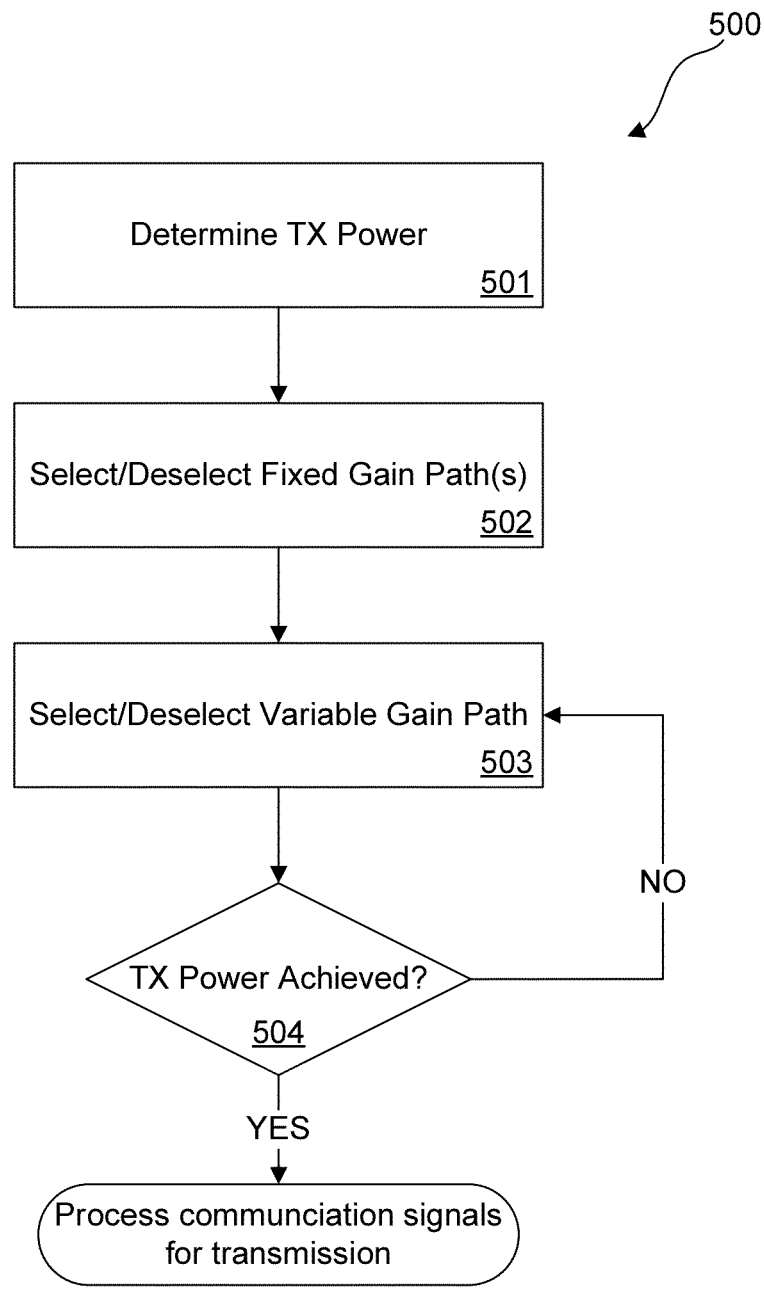
FIG. 5 illustrates a flow diagram for a transmitter in accordance with the present disclosure.

FIG. 5 illustrates a flow diagram 500 for a transmitter in accordance with the present disclosure. In step 501, a desired transmitter output power level is determined from output power requirements of the transmission circuit, radio circuitry and/or its associated communications network. In step 502, a first one or a first combination of paths including fixed gain communication signal processing chains are selected/deselected from N binary weighted communication signal processing paths to provide course power tuning. In step 503, a path including variable gain communication signal processing elements is selected from N binary weighted communication signal processing paths to provide fine power tuning. If the desired TX power is met or substantially met by the selected combination of paths 504, then the transmitter collectively processes communication signals through these paths. If the desired TX power is not met 504, the variable gain communication signal processing path is reselected with a different variable gain to better match the power requirements.

Similar to multimode transmitters, LTE transmitters typically need improved linearity with respect to Wideband Code Division Multiple Access (WCDMA). The design challenges with LTE transmitters remain from those of multimode transmitters in addition to higher peak-to-average ratios. LTE operation demands a very linear transmitter since there is no relaxation factor from tone to modulation. Additionally, transmitter ACLR is limited due to mixing of local oscillation (LO) plus baseband and 3rd harmonic of local oscillation (3LO) plus baseband in pre-power amplification (pre-PA). The 3rd order non-linearity of pre-PA generates an undesired LO plus 3 baseband (3BB) at the output in addition to desired LO-baseband (as illustrated in FIG. 6, described hereafter).

Typical LTE transmitter designs also aim to improve the linearity of pre-PA, however, these configurations tend to result in higher power consumption. Other designs include harmonic rejection mixers at a cost of larger area and higher power consumption.

Figure 6:
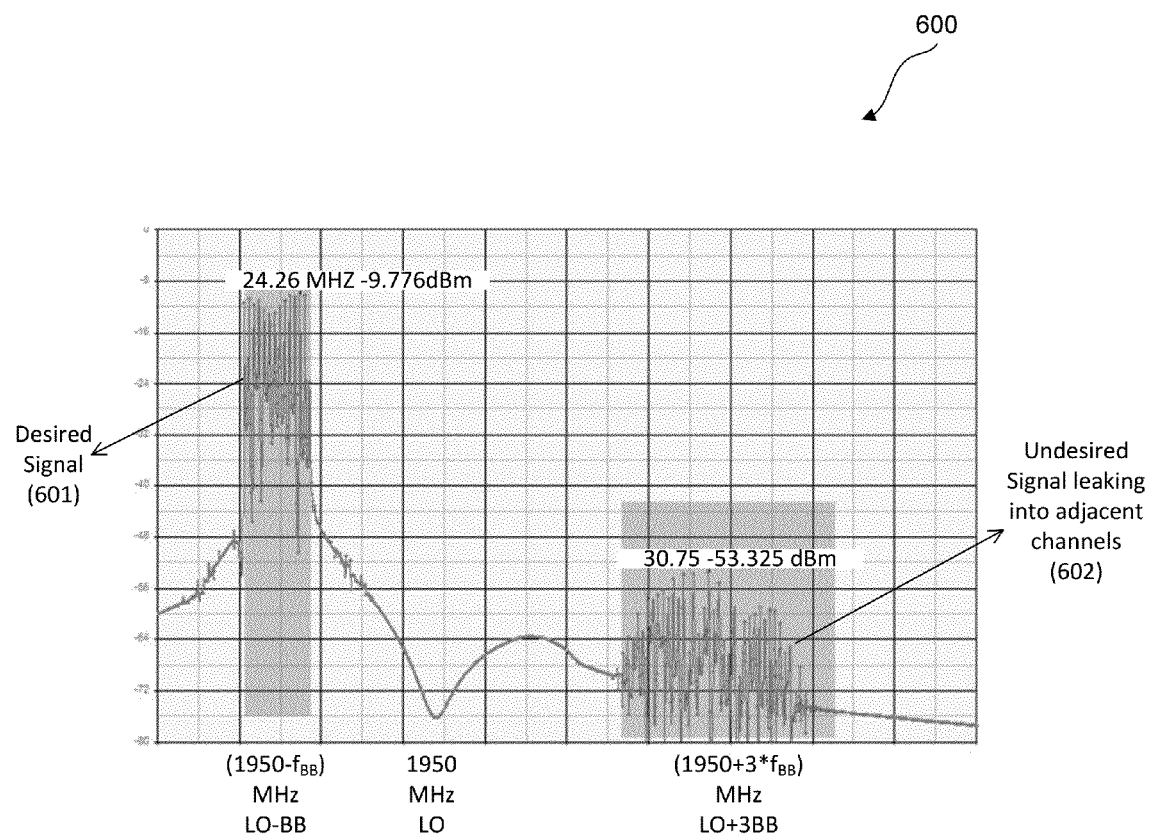
FIG. 6 illustrates a signal diagram for a transmitter in accordance with the present disclosure.

FIG. 6 illustrates a signal diagram for a transmitter in accordance with the present disclosure. As shown, FIG. 6 illustrates a 5 MHz LTE TX output spectrum. Transmission output spectrum 600 shows a desired transmission signal band (1950 MHz) 601 with undesired signal leakage 602 into adjacent channels (3LO-$3^{rd}$ harmonic of LO).

In one embodiment, a transmitter is included that is divided into two sections: a high power path with 3LO attenuation at the pre-PA input and a low power path without a notch filter. The high power path supports 10-15 dB of dynamic range for maximum output power and the low power path is used for output powers below 15 dB. Each path uses a different supply voltage. Such a transmitter provides power savings for LTE applications for high power outputs and for low power outputs.

Figure 7:
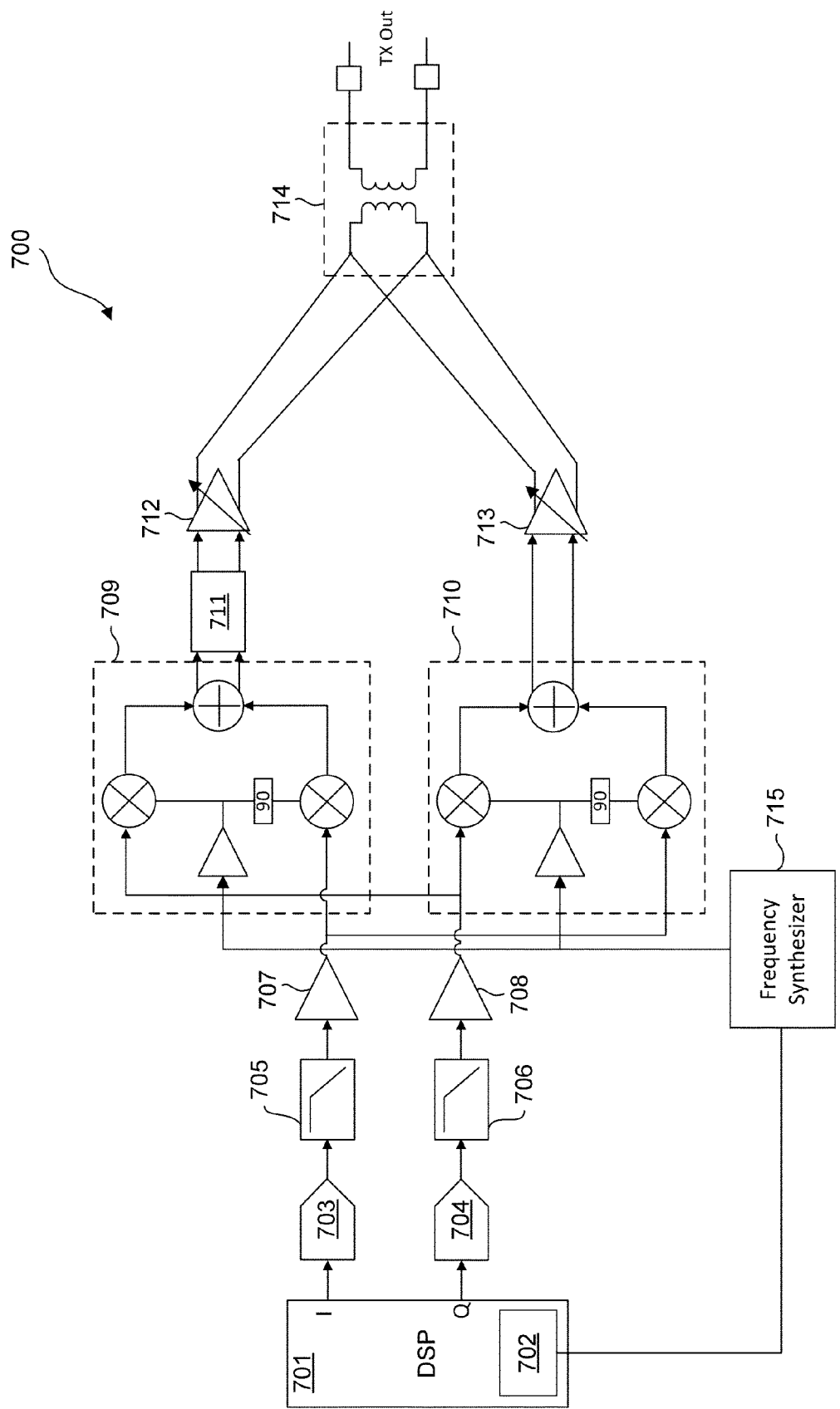
FIG. 7 illustrates another embodiment of a circuit diagram for a transmitter in accordance with the present disclosure.

FIG. 7 illustrates another embodiment of a circuit diagram for a transmitter in accordance with the present disclosure. Transmitter 700 includes DSP 701 with channel processing 702 (coupled to frequency synthesizer 715 to produce a local oscillator (LO) source). Synthesizer 715 would typically include a phase-locked loop plus local oscillator generator as is known in the art. DSP 701 converts outbound data into outbound baseband signals, which includes an in-phase component (I) and a quadrature component (Q). Digital-to-analog converters 703 and 704 convert the in-phase and quadrature baseband signal components into analog signals. The baseband signals are filtered by low pass filters 705 and 706.

The baseband signals are provided to one of the two paths depending on the desired TX output power. For example, for high powered TX outputs, the baseband signals are provided to baseband buffers 707 and 708 that buffer the baseband signal and provide the buffered baseband signal to mixers circuit 709 for up-conversion using the LO output from frequency synthesizer 715. A harmonic notch filter 711 is used to attenuate, for example, 3LO prior to pre-PA by adding a 3LO notch filter. Additional notch filters (e.g., for odd order harmonics) can be included before the pre-PA 712 to attenuate additional harmonics (e.g., 5LO, 7LO, etc.). Up-converted and filtered communication signals are passed to pre-PA 712 and to impedance matching circuit 714

For low power TX outputs, the baseband signals are provided to baseband buffers 707 and 708 that buffer the baseband signal and provide the buffered baseband signal to mixers circuit 710 for up-conversion using the LO output from frequency synthesizer 715. Notch filters are not included in this path. Up-converted communication signals are passed to pre-PA 713 and to impedance matching circuit 714.

The transmitter as described may be included as part of a stand-alone transmitter, transceiver or be modified as is known in the art to operate within a receiver to provide variable power functionality. The circuitry may be used within a portable handheld communications device (e.g., cellular communications circuitry for a mobile communications device, smartphone, tablet, etc.) or as part of a fixed communications device (e.g., base station, access point, router, etc.) without departing from the scope of the present disclosure.

As may be used herein, the term "external" refers to any structure or component not located within the same transceiver IC (chip). These external components are, in various embodiments, located on the same circuit board, other ICs, chips, or separate circuit boards. It is envisioned, in some embodiments, that "external" components would be co-located on the same IC with protective electrical/noise isolation between co-located transceiver and external components. The terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operatively connected", "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry includes the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed technology described herein. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed technology described herein. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as CMOS, as one of ordinary skill in the art will appreciate, the transistors may be implemented using any type of transistor structure including, but not limited to, bipolar, field effect (FET) or metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

What is claimed is:

1. A method in a wireless communications transmitter comprising:
   determining a desired transmitter output power;
   selecting from N binary weighted communication signal processing paths a first one or a first combination of paths including fixed gain communication signal processing;
   selecting from the N binary weighted communication signal processing paths a second path including variable gain communication signal processing; and
   wherein power used during collective processing of communication signals through a combination of the selected first one or first combination of paths and the second path substantially equals the desired transmitter output power.

2. The method of claim 1, wherein the weighting of the N binary weighted communication signal processing paths comprises scaling of one or more circuit components located within the N binary weighted communication signal processing paths.

3. The method of claim 1, wherein the selecting the first one or the first combination of paths provides course power tuning and the selecting of the second path provides fine power tuning.

4. The method of claim 3, wherein the fine power tuning further comprises selecting a specific setting for a variable power amplifier driver located within the second path.

5. A wireless communications transmitter comprising:
   N binary weighted communication signal processing paths comprising:
      a first group of communication signal processing paths including a plurality of fixed gain communication signal processing chains;
      a second communication signal processing path including a variable gain communication signal processing chain; and
   a processor coupled to the N binary weighted communication signal paths, the processor configured to select, based on a desired transmission output power, one or more communication signal processing paths from the first group and additionally the second communication signal processing path to collectively process communication signals for transmission.

6. The wireless communications transmitter of claim 5, wherein a fixed gain differs for one or more of the plurality of fixed gain communication signal processing chains.

7. The wireless communications transmitter of claim 5, wherein a value of a fixed gain for each of the plurality of fixed gain communication signal processing chains is based on a weighting of the N binary weighted communication signal paths.

8. The wireless communications transmitter of claim 7, wherein the weighting comprises scaling of one or more circuit components located within the N binary weighted communication signal processing paths.

9. The wireless communications transmitter of claim 5, wherein the plurality of fixed gain communication signal processing chains each comprise a sequentially coupled input buffer, up-converter and power amplifier driver.

10. The wireless communications transmitter of claim 5, wherein the variable gain communication signal processing chain comprises a sequentially coupled input buffer, up-converter and variable gain power amplifier driver.

11. The wireless communications transmitter of claim 5, wherein the processor configured to select comprises a selection bit sequence for: selecting the one or more communication signal processing paths from the first group; selecting the additional second communication signal processing path; and selection of a gain for the variable gain communication signal processing chain.

12. The wireless communications transmitter of claim 11, wherein most significant bits (MSBs) of the selection bit sequence provide course power tuning and least significant bits (LSBs) provide fine power tuning.

13. The wireless communications transmitter of claim 12, wherein the fine power tuning further comprises selecting a specific setting for a variable power amplifier driver located within the second communication signal processing path.

14. The wireless communications transmitter of claim 11, wherein the selection bit sequence provides at least 6 dB of gain control per bit.

15. The wireless communications transmitter of claim 5, wherein the N binary weighted communication signal processing paths comprise four paths; the plurality of fixed gain communication signal processing chains includes three paths and the variable gain communication signal processing chain includes one path.

16. The wireless communications transmitter of claim 15, wherein weighting of the three paths comprises 1:2, 1:4 and 1:8 of the total transmitter output power, respectively and the weighting of the one path comprises up to 1:8 of the desired transmission output power.

* * * * *